(12) United States Patent
Seo et al.

(10) Patent No.: US 8,736,526 B2
(45) Date of Patent: May 27, 2014

(54) DISPLAY UNIT WITH ORGANIC LIGHT EMITTING DEVICES

(75) Inventors: Yuuki Seo, Kanagawa (JP); Junichi Yamashita, Tokyo (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 642 days.

(21) Appl. No.: 12/831,390

(22) Filed: Jul. 7, 2010

(65) Prior Publication Data

US 2011/0012935 A1    Jan. 20, 2011

(30) Foreign Application Priority Data

Jul. 16, 2009    (JP) ................................ P2009-168096

(51) Int. Cl.
    *G09G 3/32*    (2006.01)
(52) U.S. Cl.
    USPC .......................................................... 345/82
(58) Field of Classification Search
    USPC ................... 345/690, 76–77, 82–83; 313/504
    See application file for complete search history.

(56) References Cited

U.S. PATENT DOCUMENTS

| | | | |
|---|---|---|---|
| 6,650,045 B1 * | 11/2003 | Forrest et al. | 313/504 |
| 7,325,943 B2 | 2/2008 | Benoit et al. | |
| 2006/0125716 A1 * | 6/2006 | Wong et al. | 345/46 |
| 2009/0066686 A1 * | 3/2009 | Ryu | 345/213 |

FOREIGN PATENT DOCUMENTS

JP    2005-531102    10/2005

* cited by examiner

*Primary Examiner* — Chanh Nguyen
*Assistant Examiner* — Jonathan Blancha
(74) *Attorney, Agent, or Firm* — K&L Gates LLP

(57) ABSTRACT

A display unit with which luminance is able to be improved and a wide view angle is able to be secured while increase of the power consumption is inhibited is provided. The display unit includes a first region placing priority on front face luminance in which an aperture ratio of a light emitting region is relatively small, a second region placing priority on view angle luminance in which the aperture ratio of the light emitting region is relatively large, and a drive means for driving the first region and the second region.

9 Claims, 17 Drawing Sheets

| | |
|---|---|
| ▓ METAL LAYER IN FIRST LAYER | ◉ CONNECTION SECTION BETWEEN METAL LAYER IN FIRST LAYER AND METAL LAYER IN SECOND LAYER |
| ▫ METAL LAYER IN SECOND LAYER | ▒ CONNECTION SECTION BETWEEN METAL LAYER IN SECOND LAYER AND FIRST ELECTRODE 12 |

- ▨ METAL LAYER IN FIRST LAYER
- ▦ CONNECTION SECTION BETWEEN METAL LAYER IN FIRST LAYER AND METAL LAYER IN SECOND LAYER
- ☐ METAL LAYER IN SECOND LAYER
- ▩ CONNECTION SECTION BETWEEN METAL LAYER IN SECOND LAYER AND FIRST ELECTRODE 12

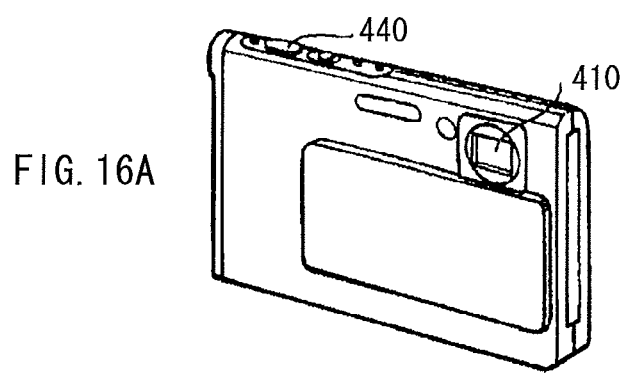
F I G. 16A
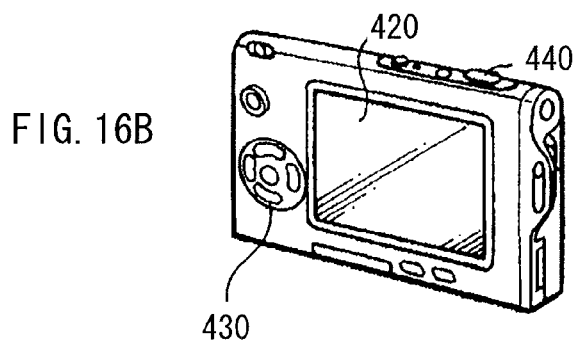
F I G. 16B

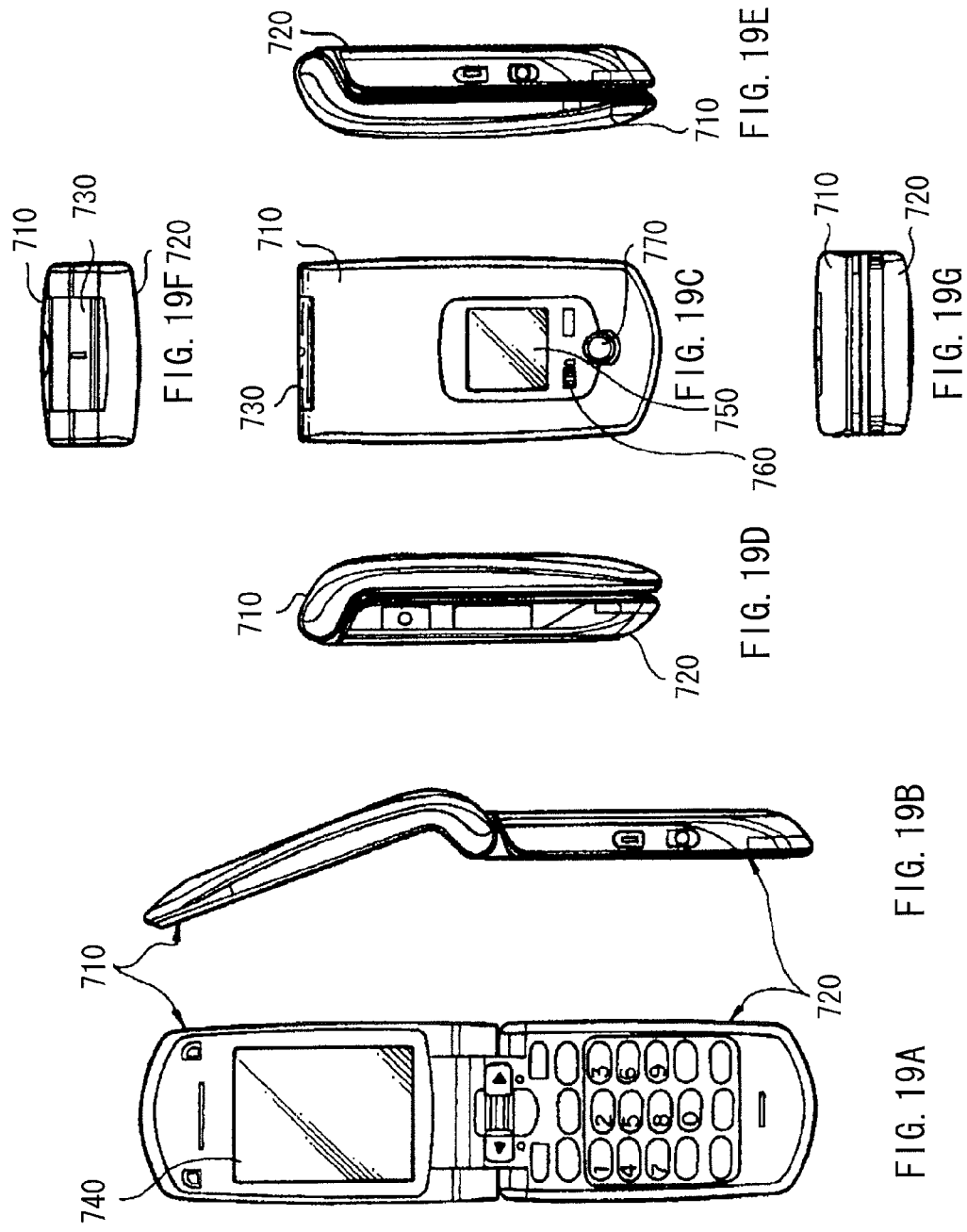

DISPLAY UNIT WITH ORGANIC LIGHT EMITTING DEVICES

CROSS REFERENCES TO RELATED APPLICATIONS

The present application claims priority to Japanese Priority Patent Application JP 2009-168096 filed in the Japan Patent Office on Jul. 16, 2009, the entire content of which is hereby incorporated by reference.

BACKGROUND

The present application relates to a display unit that includes an organic light emitting device or the like as a display device.

In recent years, as a display unit replacing a liquid crystal display, an organic EL display using a self-luminous type organic light emitting device including an organic layer has been practically used. Since the organic EL display is a self-luminous type display, its view angle is wider than that of the liquid crystal display or the like. Further, the organic EL display has sufficient response to a high-definition and high-speed video signal.

The organic light emitting device used for such an organic EL display has the organic layer including a light emitting layer between a pair of electrodes. By applying a voltage between the electrodes, electron-hole recombination is generated in the light emitting layer, and light is emitted. The emitted light is extracted from one electrode.

In the organic EL display, in order to improve luminance while inhibiting increase of power consumption, various studies have been made. For example, a technique to provide a reflector structure including an aperture having a reflecting film on a side wall on the light extraction side of the organic light emitting device has been proposed (for example, see Japanese Unexamined Patent Application Publication No. 2005-531102). In the organic EL display provided with the reflector structure, light from the light emitting device is reflected from the reflecting face of the side wall of the aperture in the vertical direction to the display face.

SUMMARY

However, in the display having the foregoing reflector structure, while the front face luminance is able to be improved, the view angle is hardly secured for the following reason. In order to secure the luminance in the vertical direction to the display face, it is necessary to decrease the aperture size (decrease the aperture ratio) of the reflector structure. In this case, luminance in the diagonal direction to the display face is decreased, and thus the view angle is decreased. Meanwhile, in order to secure the luminance in the diagonal direction to the display face, it is necessary to increase the aperture size of the reflector structure (increase the aperture ratio). In this case, while the view angle is easily secured, light amount extracted in the vertical direction to the display face is less likely to be obtained, and thus it is necessary to apply a high drive voltage.

That is, in the existing organic EL display, the luminance in the diagonal direction is lowered in the case where the front face luminance is tried to be secured without increasing power consumption, and the front face luminance is easily decreased in the case where the luminance in the diagonal direction is tried to be secured.

In view of the foregoing disadvantage, in an embodiment, it is desirable to provide a display unit with which luminance is able to be improved and a wide view angle is able to be secured while increase of the power consumption is inhibited.

According to an embodiment, there is provided a display unit including a first region placing priority on front face luminance in which an aperture ratio of a light emitting region is relatively small; a second region placing priority on view angle luminance in which the aperture ratio of the light emitting region is relatively large; and a drive means for driving the first region and the second region.

In the display unit of an embodiment, the aperture ratio of the light emitting region in the first region placing priority on front face luminance is relatively small, and the aperture ratio of the light emitting region in the second region placing priority on view angle luminance is relatively large. Thus, in the first region, at least compared to in the second region, light extracted from the light emitting region to the display face side (extracted light) is less likely to be diffused. Meanwhile, in the second region, diffusion of the extracted light from the light emitting region is wider than that in the first region. Thus, in the case where the first region and the second region are similarly driven by the drive means, each extracted light of the first region and the second region is overlapped. Accordingly, while light amount in the front face direction to the display face is increased, light amount in the diagonal direction is secured.

The display unit of an embodiment includes the first region placing priority on front face luminance in which the aperture ratio of the light emitting region is relatively small; the second region placing priority on view angle luminance in which the aperture ratio of the light emitting region is relatively large; and the drive means for driving the first region and the second region. Thus, balance between luminance in the front face direction and luminance in the diagonal direction to the display face becomes favorable. Accordingly, while increase of power consumption is inhibited, luminance is able to be improved and a wide view angle is able to be secured.

Other and further features and advantages of the invention will appear more fully from the following description.

Additional features and advantages are described herein, and will be apparent from the following Detailed Description and the figures.

BRIEF DESCRIPTION OF THE FIGURES

FIG. 16A is a perspective view illustrating an appearance viewed from the front side of a second application example, and FIG. 16B is a perspective view illustrating an appearance viewed from the rear side of the second application example.

FIG. 19A is an elevation view of a fifth application example unclosed, FIG. 19B is a side view thereof, FIG. 19C is an elevation view of the fifth application example closed, FIG. 19D is a left side view thereof, FIG. 19E is a right side view thereof, FIG. 19F is a top view thereof, and FIG. 19G is a bottom view thereof.

DETAILED DESCRIPTION

Figure 1:
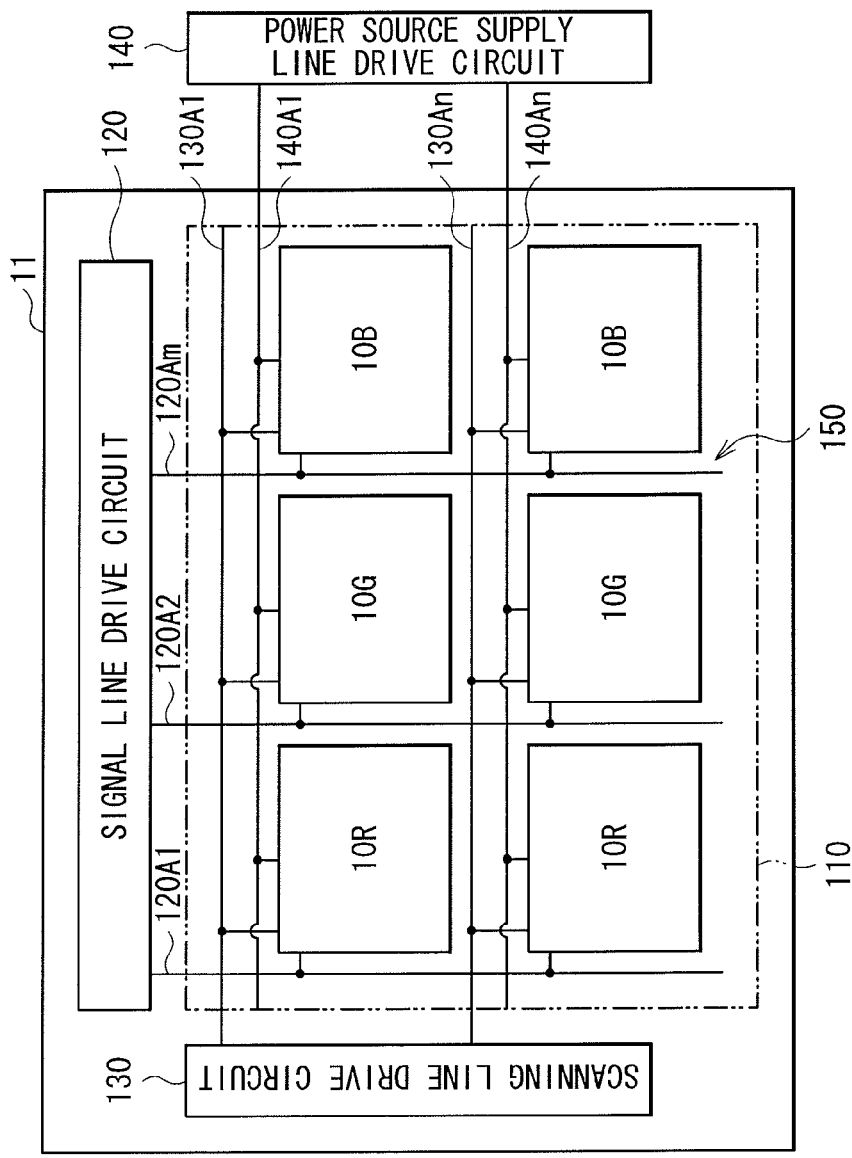
FIG. 1 is a view illustrating a circuit configuration of a display unit according to a first embodiment.

The present application is described in detail below with reference to the drawings according to an embodiment. The description will be given in the following order:

1. First embodiment (example that a pixel placing priority on front face luminance and a pixel placing priority on view angle luminance are included)
2. Second embodiment (example that a region placing priority on front face luminance and a region placing priority on view angle luminance are included in one pixel)
3. Module and application examples 1. First Embodiment Example that a Pixel Placing Priority on Front Face Luminance and a Pixel Placing Priority on View Angle Luminance are Included FIG. 1 illustrates a circuit configuration of a display unit according to a first embodiment. The display unit is used as an ultrathin organic light emitting color display unit or the like. In the display unit, a display region 110 is formed on a base 11. Around the display region 110, for example, a signal line drive circuit 120, a scanning line drive circuit 130, and a power source supply line drive circuit 140 that are drivers for displaying a video are formed.

In the display region 110, a plurality of organic light emitting devices 10R, 10G, and 10B that are two-dimensionally arranged in a matrix state and a pixel drive circuit 150 for driving the organic light emitting devices are formed. In the pixel drive circuit 150, a plurality of signal lines 120A (120A1, 120A2, *snip* 120 μm *snip*) are arranged in the column direction, and a plurality of scanning lines 130A (130A1, *snip* 130An *snip*) and a plurality of power source supply lines 140A (140A1, *snip* 140An *snip*) are arranged in the row direction. One of the organic light emitting devices 10R, 10G, and 10B is provided correspondingly to each intersection of each signal line 120A and each scanning line 130A. Each signal line 120A is connected to the signal line drive circuit 120, and each scanning line 130A is connected to the scanning line drive circuit 130, and each power source supply line 140A is connected to the power source supply line drive circuit 140.

The signal line drive circuit 120 is intended to supply a signal voltage of a video signal corresponding to luminance information supplied from a signal supply source (not illustrated) to the organic light emitting devices 10R, 10G, and 10B selected through the signal line 120A.

The scanning line drive circuit 130 is composed of a shift resistor or the like that sequentially shifts (transfers) a start pulse in synchronization with an inputted clock pulse. The scanning line drive circuit 130 is intended to scan writing of the video signal into the respective organic light emitting devices 10R, 10G, and 10B in units of row, and sequentially supply a scanning signal to each scanning line 130A.

The power source line drive circuit 140 is composed of a shift resistor or the like that sequentially shifts (transfers) the start pulse in synchronization with the inputted clock pulse. The power source line drive circuit 140 supplies one of a first electric potential and a second electric potential that are different from each other as appropriate to each power source supply line 140 in synchronization with the scanning in units of row by the scanning line drive circuit 130. Thereby, conduction state or non-conduction state of an after-mentioned drive transistor Tr1 is selected.

Figure 2:
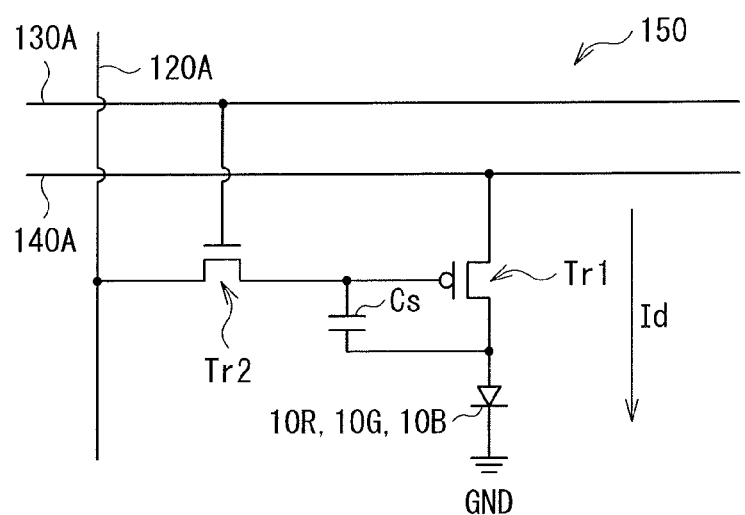
FIG. 2 is a view illustrating an example of the pixel drive circuit illustrated in FIG. 1.

FIG. 2 illustrates an example of the pixel drive circuit 150. The pixel drive circuit 150 is an active type drive circuit that is formed in a layer located lower than an after-mentioned first electrode 12. The pixel drive circuit 150 has the drive transistor Tr1, a writing transistor Tr2, a capacitor (retentive capacity) Cs between the drive transistor Tr1 and the writing transistor Tr2, and the organic light emitting device 1 OR (or 10G, 10B) serially connected to the drive transistor Tr1 between the power source supply line 140A and a common power source supply line (GND). The drive transistor Tr1 and the writing transistor Tr2 are composed of a general thin film transistor (TFT (Thin Film Transistor)). The structure thereof is not particularly limited, and may be, for example, inversely staggered structure (so-called bottom gate type) or staggered structure (top gate type).

For example, a drain electrode of the writing transistor Tr2 is connected to the signal line 120A. The video signal from the signal line drive circuit 120 is supplied to the drain electrode of the writing transistor Tr2. A gate electrode of the writing transistor Tr2 is connected to the scanning line 130A. The scanning signal from the scanning line drive circuit 130 is supplied to the gate electrode of the writing transistor Tr2. Further, a source electrode of the writing transistor Tr2 is connected to a gate electrode of the drive transistor Tr1.

For example, a drain electrode of the drive transistor Tr1 is connected to the power source supply line 140A, and one of the first electric potential and the second electric potential supplied from the power source supply line drive circuit 140 is set. A source electrode of the drive transistor Tr1 is connected to the organic light emitting device 10R (or 10G, 10B).

The retentive capacity Cs is formed between the gate electrode of the drive transistor Tr1 (source electrode of the writing transistor Tr2) and the source electrode of the drive transistor Tr1.

Figure 3:
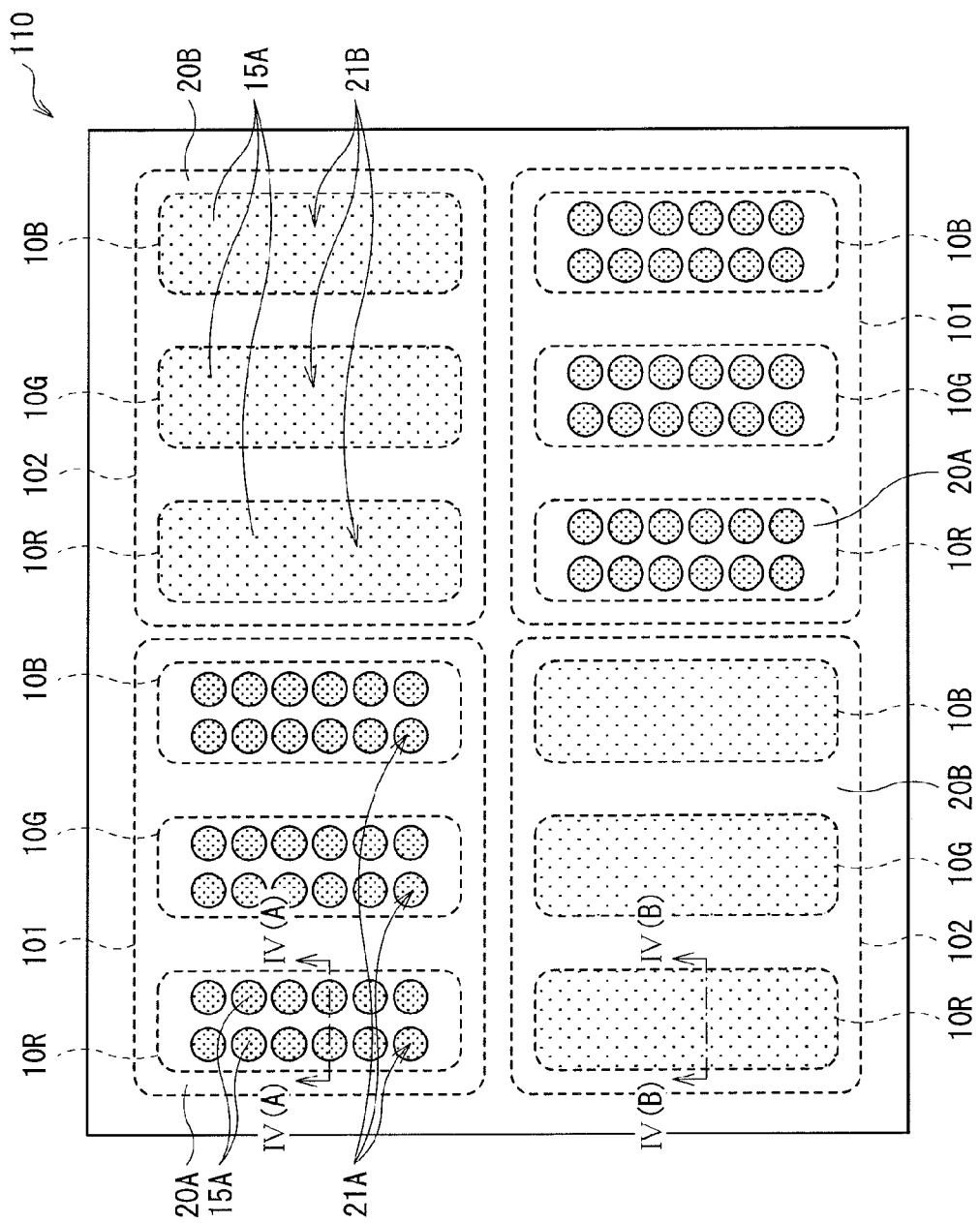
FIG. 3 is a plan view illustrating a structure of the display region illustrated in FIG. 1.

FIG. 3 illustrates an example of a planar structure of the display region 110. In the display region 110, a pixel placing priority on front face luminance 101 and a pixel placing priority on view angle luminance 102 are located adjacent to each other, and are two-dimensionally arranged in a state of matrix as a whole. In the respective pixels 101 and 102, the organic light emitting device 10R generating red light, the organic light emitting device 10G generating green light, and the organic light emitting device 10B generating blue light are formed on the base 11. On the organic light emitting devices 10R, 10G, and 10B of the pixel 101, a first reflector structure 20A is formed. The first reflector structure 20A has a plurality of circular apertures 21A having a reflecting face 22A on a side wall. Thereby, the aperture ratio of a light emitting region 15A in the pixel 101 is relatively small. On the organic light emitting devices 10R, 10G, and 10B of the pixel 102, a second reflector structure 20B is formed. The second reflector structure 20B has a rectangular aperture 21B having a reflecting face 22B on a side wall. Thereby, the aperture ratio of the light emitting region 15A is relatively large. Thus, in the pixel 101, at least compared to in the pixel 102, light extracted from the light emitting region 15A to the display face side (extracted light) is less likely to be diffused. Meanwhile, in the pixel 102, broadness of the extracted light from the light emitting region 15A is wider than that in the first region. Thus, in the case where the pixels 101 and 102 are concurrently driven, each extracted light of the pixels 101 and 102 is overlapped. Accordingly, while light amount in the front face direction to the display face is increased, light amount in the diagonal direction is also secured.

Next, a description will be given of detailed structures of the organic light emitting devices 10R, 10G, and 10B and the reflector structures 20A and 20B in the pixels 101 and 102 with reference to FIG. 4A to FIG. 5 together with FIG. 3. The pixels 101 and 102 have common structures except that the structure of the reflector structure 20A is different from that of the reflector structure 20B. Further, the organic light emitting devices 10R, 10G, and 10B respectively formed in the pixels 101 and 102 have common structures except that each structure of an organic layer 14 is partly different. Thus, a description will be hereinafter given of the organic light emitting device 10R as a representative for the common sections.

Figure 4A:
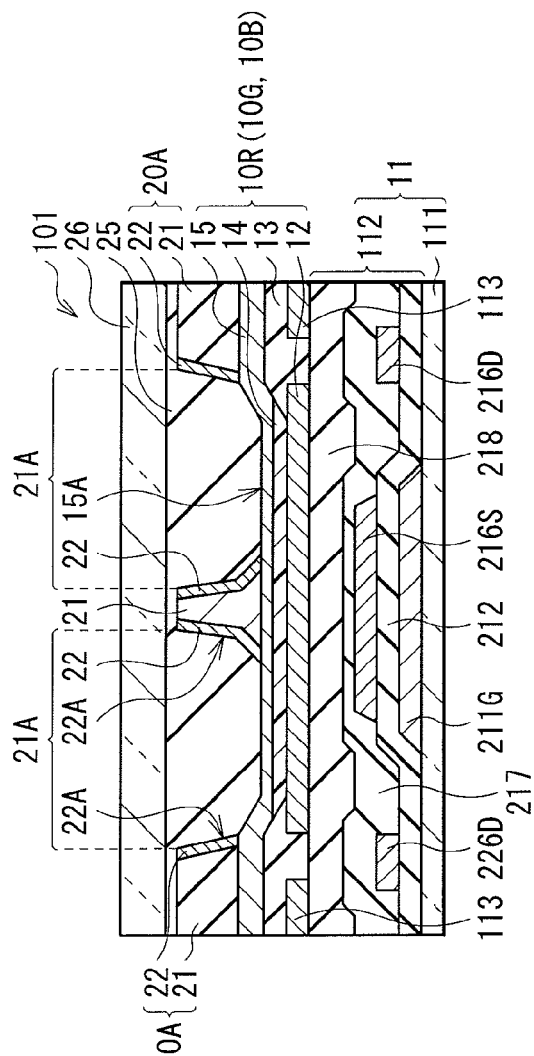
FIG. 4A is a cross sectional structure of the pixel placing priority on front face luminance illustrated in FIG. 3.
Figure 4B:
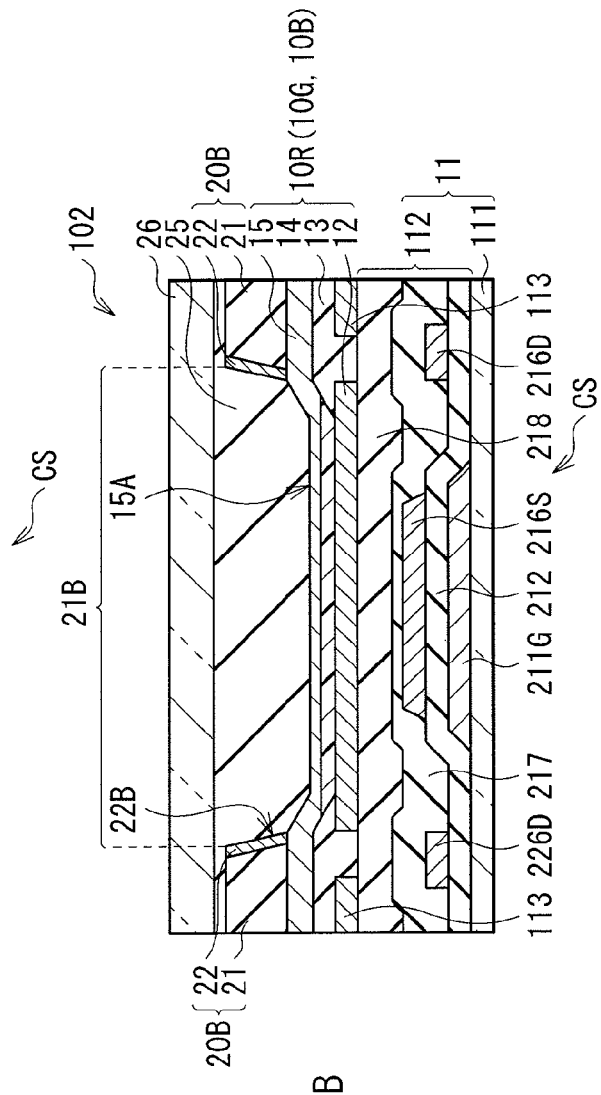
FIG. 4B is a cross sectional structure of the pixel placing priority on view angle luminance illustrated in FIG. 3.
Figure 5:
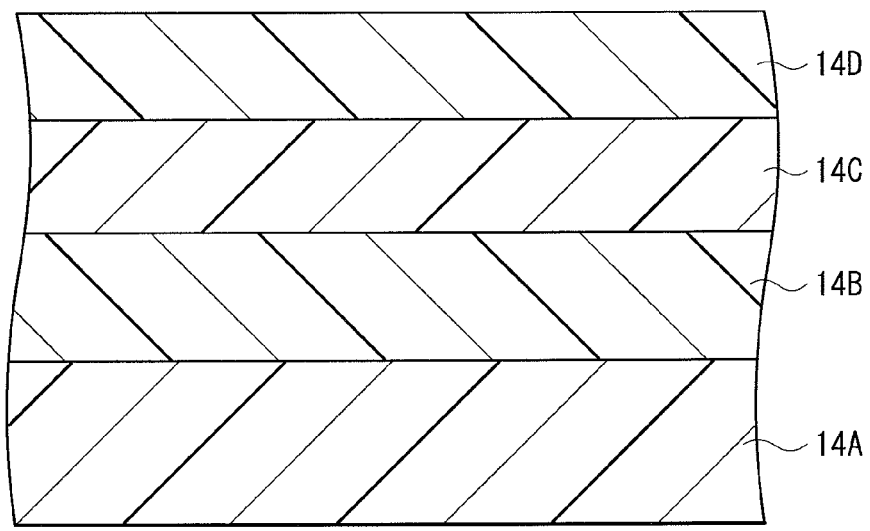
FIG. 5 is an enlarged cross sectional view of the organic layer illustrated in FIGS. 4A and 4B.

FIGS. 4A and 4B illustrate cross sectional structures of the pixels 101 and 102. More specifically, FIG. 4A is a cross sectional view taken along line IV(A)-IV(A) of the pixel 101 illustrated in FIG. 3, and FIG. 4B is a cross sectional view taken along line IV(B)-IV(B) of the pixel 102 illustrated in FIG. 3. FIG. 5 is an enlarged cross sectional view of the organic layer 14 illustrated in FIGS. 4A and 4B.

The organic light emitting device 10R includes the first electrode 12 as an anode, an interelectrode insulating film 13, the organic layer 14 including a light emitting layer 14C, and a second electrode 15 as a cathode sequentially from the base 11 side. A region surrounded by the interelectrode insulating film 13 of the organic layer 14 is the light emitting region 15A. On the light extraction side of light from the light emitting region 15A, the reflector structure 20A and the reflector structure 20B are respectively provided in the pixel 101 and the pixel 102. The reflector structures 20A and 20B respectively have the apertures 21A and 21B for extracting light. A protective layer 25 is formed in the apertures 21A and 21B and on the reflector structures 20A and 20B. A sealing substrate 26 is provided on the protective layer 25 to seal the structure. Further, the organic light emitting device 10R is surrounded by an auxiliary wiring 113.

In the organic light emitting device 10R, the first electrode 12 functions as a reflecting film having light reflectance, while the second electrode 15 functions as a transparent film or a semi-transmissive film having light transmittance. By the first electrode 12 and the second electrode 15, light generated in the light emitting layer 14C is extracted from the sealing substrate 26 side.

The first electrode 12 is desirably made of a material having high reflectance in order to improve light emitting efficiency. The first electrode 12 is, for example, from 100 nm to 1000 nm thick both inclusive, and is composed of a simple substance or an alloy of metal elements such as silver (Ag), aluminum (Al), chromium (Cr), titanium (Ti), iron (Fe), cobalt (Co), nickel (Ni), molybdenum (Mo), copper (Cu), tantalum (Ta), tungsten (W), platinum (Pt), neodymium (Nd), and gold (Au). The first electrode 12 may have a multilayer structure as long as the structure has light reflectance. The first electrode 12 having the multilayer structure may have a layer made of a transparent conductive material such as indium tin oxide (ITO), zinc oxide (ZnO), and tin oxide ($SnO_2$) above or below the layer made of the metal material having high reflectance described above, for example. The first electrode 12 is formed to cover part of the surface of the base 11, and fill in a connection hole 114. Thereby, the first electrode 12 becomes in a state of being conducted to the drive transistor Tr1 (a metal layer 216S thereof) through the connection hole 114.

The interelectrode insulating film 13 is provided to fill in a gap between each first electrode 12 and cover the end face of the first electrode 12 and the top face of the peripheral section. By the interelectrode insulating film 13, insulation property between the first electrode 12 and the second electrode 15 is secured, and the aperture of the light emitting region 15A of the organic light emitting device 10R is formed into a desired shape accurately. Examples of material of the interelectrode insulating film 13 include an organic material such as polyimide.

The organic layer 14 is provided on the top face of the first electrode 12. For example, as illustrated in FIG. 5, the organic layer 14 has a hole injection layer 14A, a hole transport layer 14B, the light emitting layer 14C, and an electron transport layer 14D sequentially from the first electrode 12 side. Such a structure is similarly applied to the organic light emitting devices 10G and 10B.

The hole injection layer 14A is intended to improve the hole injection efficiency and functions as a buffer layer to prevent current leakage. The hole transport layer 14B is intended to improve efficiency to transport an electron hole to the light emitting layer 14C. The light emitting layer 14C is intended to generate light due to electron-hole recombination by applying the electric field. The electron transport layer 14D is intended to improve efficiency to transport electrons to the light emitting layer 14C. An electron injection layer (not illustrated) composed of LiF and $Li_2O$ may be provided between the electron transport layer 14D and the second electrode 15.

A structure of the organic layer 14 varies according to light emitting color of the organic light emitting devices 10R, 10G, and 10B. A description will be given in detail of the respective organic layers 14 of the organic light emitting devices 10R, 10G, and 10B.

The hole injection layer 14A of the organic light emitting device 10R is, for example, from 5 nm to 300 nm both inclusive thick, and is composed of 4,4',4"-tris(3-methylphenylphenylamino)triphenyl amine (m-MTDATA) or 4,4',4"-tris(2-naphthylphenylamino)triphenyl amine (2-TNATA). The hole transport layer 14B of the organic light emitting device 10R is, for example, from 5 nm to 300 nm both inclusive thick, and is composed of bis[(N-naphthyl)-N-phenyl] benzidine (α-NPD). The light emitting layer 14C of the organic light emitting device 10R is, for example, from 10 nm to 100 nm both inclusive thick, and is composed of a material in which 40 volume % of 2,6-bis [4[N-(4-metoxyphenyl)-N-phenyl]aminostyril]naphthalene-1,5-dicarbonitrile (BSN-BCN) is mixed with 8-quinolinol aluminum complex ($Alq_3$). The electron transport layer 14D of the organic light emitting device 10R is, for example, from 5 nm to 300 nm both inclusive thick, and is composed of $Alq_3$.

The hole injection layer 14A of the organic light emitting device 10G is, for example, from 5 nm to 300 nm both inclusive thick, and is composed of m-MTDATA or 2-TNATA. The hole transport layer 14B of the organic light emitting device 10G is, for example, from 5 nm to 300 nm both inclusive thick, and is composed of α-NPD. The light emitting layer 14C of the organic light emitting device 10G is, for example, from 10 nm to 100 nm both inclusive thick, and is composed of a material in which 3 volume % of coumarin 6 is mixed with $Alq_3$. The electron transport layer 14D of the organic light emitting device 10G is, for example, from 5 nm to 300 nm both inclusive thick, and is composed of $Alq_3$.

The hole injection layer 14A of the organic light emitting device 10B is, for example, from 5 nm to 300 nm both inclusive thick, and is composed of m-MTDATA or 2-TNATA. The hole transport layer 14B of the organic light emitting device 10B is, for example, from 5 nm to 300 nm both inclusive thick, and is composed of α-NPD. The light emitting layer 14C of the organic light emitting device 10B is, for example, from 10 nm to 100 nm both inclusive thick, and is composed of spiro 6Φ. The electron transport layer 14D of the organic light emitting device 10B is, for example, from 5 nm to 300 nm both inclusive thick, and is composed of $Alq_3$.

The second electrode 15 is, for example, from 5 nm to 50 nm both inclusive thick, and is composed of a simple substance or an alloy of metal elements such as aluminum (Al), magnesium (Mg), calcium (Ca), and sodium (Na). Specially, an alloy of magnesium and silver (MgAg alloy) or an alloy of aluminum (Al) and lithium (Li) (AlLi alloy) is preferable. The second electrode 15 is provided for the all organic light emitting devices 10R, 10G, and 10B in common, and is arranged opposite to the first electrode 12 of the respective organic light emitting devices 10R, 10G, and 10B. Further, the second electrode 15 is electrically connected to the auxiliary wiring 113 surrounding the first electrode 12 of the organic light emitting device 10R (or 10G, 10B). The auxiliary wiring 113 is made of a conductive material having low electric resistance such as copper (Cu), and is intended to inhibit voltage drop of the second electrode 15.

The reflector structures 20A and 20B are composed of a base material 21 and a reflecting film 22.

The reflector structure 20A is intended to effectively extract light from the light emitting region 15A in the front face direction (vertical direction) to the display face. Thus, the reflector structure 20A has the plurality of apertures 21A having a circular planar shape as illustrated in FIG. 3 and having a tapered cross sectional shape as illustrated in FIG. 4A (in this case, having 2 columns by 6 rows apertures 21A on each light emitting region 15A). The reflecting film 22 is provided on the side wall of the aperture 21A, which becomes the reflecting face 22A. That is, in the reflector structure 20A, the reflecting face 22A is tilted so that the aperture diameter of each aperture 21A on the sealing substrate 26 side is larger than the aperture diameter of each aperture 21A on the second electrode 15 side. Thereby, light outputted from the light emitting region 15A of the pixel 101 in the front face direction to the display face is directly extracted in the front face direction. Meanwhile, light outputted in the diagonal direction to the display face is reflected by the side wall of the aperture 21A and is extracted in the front face direction. In the result, in the pixel 101, front face luminance is higher than luminance in the diagonal direction to the display face.

Meanwhile, the reflector structure 20B is intended to effectively extract light from the light emitting region 15A in the front face direction and the diagonal direction to the display face. Thus, the reflector structure 20B has the aperture 21B having a planar shape similar to that of the light emitting region 15A (rectangle) as illustrated in FIG. 3 and having a tapered cross sectional shape as illustrated in FIG. 4B. The reflecting film 22 is also provided on the side wall of the aperture 21B, which becomes the reflecting face 22B. That is, in the reflector structure 20B, the aperture area of the aperture 21B is larger than the aperture area of each aperture 21A. In other words, the aperture ratio of the light emitting region 15 in the reflector structure 20B is larger than that in the reflector structure 20A. In the result, in the pixel 102, compared to in the pixel 101, front face luminance is lower, but luminance in the diagonal direction to the display face is higher.

The base material 21 of the reflector structures 20A and 20B is intended to obtain a desired shape of the apertures 21A and 21B. For example, the base material 21 of the reflector structures 20A and 20B is made of an ultraviolet cured resin or a thermoset resin. The reflecting film 22 is intended to effectively reflect the light from the light emitting region 15A toward the display face side. For example, the reflecting film 22 is composed of a simple substance of titanium (Ti), aluminum (Al), and silver (Ag), or an alloy containing one or more thereof.

The protective layer 25 is intended to prevent entering of moisture or the like into the organic layer 14. The protective layer 25 is made of a material having low water permeability and low water absorbing property, and has a sufficient thickness. Further, the protective layer 25 has high transmittance to light generated in the light emitting layer 14C, and is made of, for example, a material having 80% or more transmittance. Such a protective layer 25 is, for example, about 2 μm to 3 μm both inclusive thick, and is made of an inorganic amorphous insulating material. Specifically, amorphous silicon (α-Si), amorphous silicon carbide (α-SiC), amorphous silicon nitride (α-$Si_{1-x}N_x$ ($0 \leq x \leq 1$)), and amorphous carbon (α-C) are preferable. Such an inorganic amorphous insulating material does not compose grains, and thus its water permeability is low and is able to structure the favorable protective layer 25. Further, the protective layer 25 may be made of a transparent conductive material such as ITO.

The sealing substrate 26 is adhered to the protective layer 25 with an adhesive layer (not illustrated) in between. The sealing substrate 26 is made of a material such as glass transparent to light generated in the organic light emitting devices 10R, 10G, and 10B. The sealing substrate 26 may be, for example, provided with a color filter (not illustrated). Thereby, the light generated in the organic light emitting devices 10R, 10G, an 10B is extracted, outside light reflected by the organic light emitting devices 10R, 10G, and 10B and the reflector structures 20A and 20B is absorbed, and the contrast is improved.

Though the color filter may be provided on either side of the sealing substrate 26, the color filter is preferably provided on the side of the organic light emitting devices 10R, 10G, and 10B, since thereby the color filter is not exposed on the surface and is protected by the adhesive layer. Further, in this case, the distance between the upper end of the reflector structures 20A and 20B and the color filter is decreased, and thereby light outputted from the light emitting layer 14C is able to be prevented from entering other adjacent color filter to generate mixed color. The color filter has a red filter, a green filter, and a blue filter (not illustrated). The red filter, the green filter, and the blue filter are sequentially arranged correspondingly to the organic light emitting devices 10R, 10G and 10B. The red filter, the green filter, and the blue filter are respectively formed, for example, in the shape of a rectangle without no space therebetween. The red filter, the green filter, and the blue filter are respectively made of a resin mixed with a pigment. By selecting the pigment, the red filter, the green filter, and the blue filter are adjusted so that light transmittance in a desired red, green, or blue wavelength region is high, and light transmittance in other wavelength regions is low.

Figure 6:
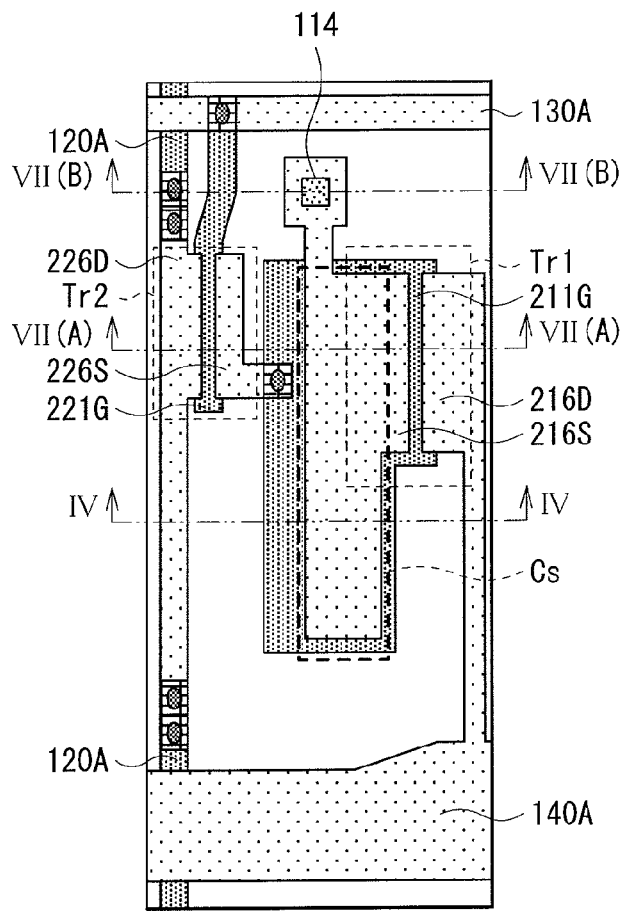
FIG. 6 is a view illustrating a planar structure of the pixel circuit formation layer illustrated in FIGS. 4A and 4B.
Figure 7A:
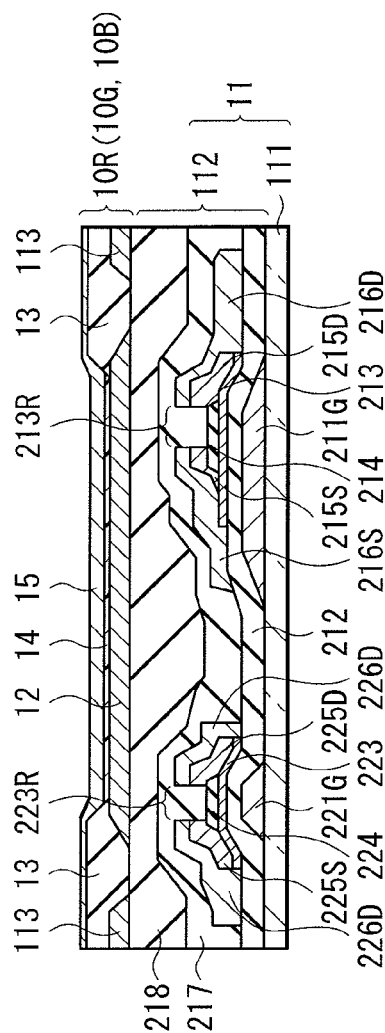
FIGS. 7A and 7B are views illustrating another cross sectional structures of the pixel circuit formation layer illustrated in FIGS. 4A and 4B.
Figure 7B:
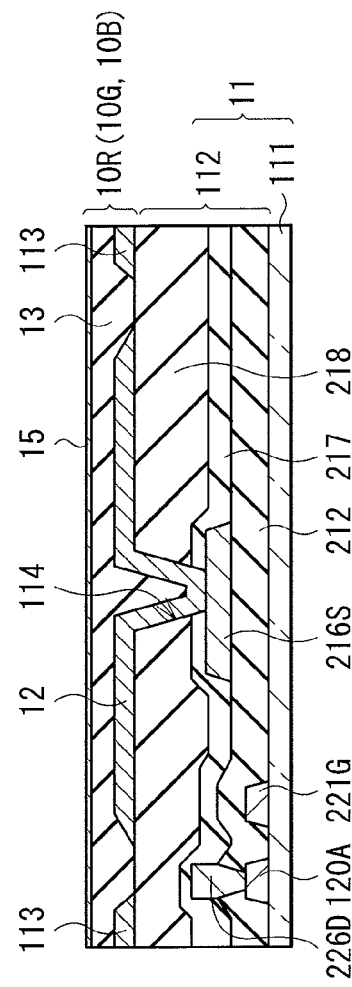

Next, a description will be given of a detailed structure of the base 11 with reference to FIG. 6 to FIG. 7B in addition to FIG. 3 to FIG. 4B. FIG. 6 is a schematic view that illustrates a planar structure of a pixel drive circuit formation layer 112 illustrated in FIGS. 4A and 4B and illustrates the pixel drive circuit 150 corresponding to the plan view of the organic light emitting device 10R (or 10G, 10B) illustrated in FIG. 3. FIG. 7A illustrates a cross sectional structure taken along line VII(A)-VII(A) in FIG. 6 in the layer including the organic light emitting device 10R (or 10G, 10B), and FIG. 7B illustrates a cross sectional structure taken along line VII(B)-VII(B) in FIG. 6 in the layer including the organic light emitting device 10R (or 10G, 10B). A cross sectional structure taken along line IV-IV in FIG. 6 corresponds to the cross sectional view of FIG. 4A or the cross sectional view of FIG. 4B.

In the base 11, the pixel drive circuit formation layer 112 including the pixel drive circuit 150 is provided on a substrate 111 made of glass, a silicon (Si) wafer, a resin or the like. On the surface of the substrate 111, as a metal layer of a first layer, a metal layer 211G as the gate electrode of the drive transistor Tr1, a metal layer 221G as the gate electrode of the writing transistor Tr2, and the signal line 120A are respectively provided. The metal layers 211G and 221G and the signal line 120A are covered with a gate insulating film 212 composed of silicon nitride, silicon oxide or the like. In a region corresponding to the metal layers 211G and 221G on the gate insulating film 212, channel layers 213 and 223 made of a semiconductor thin film composed of amorphous silicon or the like are provided. On the channel layers 213 and 223, insulative channel protective films 214 and 224 are provided to occupy channel regions 213R and 223R as a central region of the channel layers 213 and 223. In the region on both sides thereof, source regions 215S and 225S and drain regions 215D and 225D made of an n-type semiconductor thin film composed of n-type amorphous silicon or the like are provided. The drain regions 215D and 225D and the source regions 215S and 225S are separated from each other with channel protective films 214 and 224 in between. End faces thereof are separated from each other with the channel regions 213R and 223R in between. Further, as a metal layer of a second layer, metal layers 216D and 226D as a drain wiring and a drain electrode and metal layers 216S and 226S as a source wiring and a source electrode are provided to respectively cover the drain regions 215D and 225D and the source regions 215S and 225S. The metal layers 216D and 226D and the metal layers 216S and 226S have a structure in which, for example, a titanium (Ti) layer, an aluminum (Al) layer, and a titanium layer are sequentially layered. As a metal layer of the second layer, in addition to the foregoing metal layers 216D and 226D and the metal layers 216S and 226S, the scanning line 130A and the power source supply line 140A are provided. Further, the whole structure is covered with a passivation film 217 composed of silicon nitride or the like, on which a planarizing insulating film 218 made of an organic material such as polyimide and an inorganic material such as silicon oxide ($SiO_2$) is provided. While the description has been given of the drive transistor Tr1 and the writing transistor Tr2 having inversely staggered structure (so-called bottom gate type), the drive transistor Tr1 and the writing transistor Tr2 may have staggered structure (top gate type).

The display unit is able to be manufactured, for example, as follows.

First, the pixel drive circuit 150 including the drive transistor Tr1 and the writing transistor Tr2 is formed on the substrate 111. Specifically, first, a metal film is formed on the substrate 111 by, for example, sputtering. After that, the metal film is patterned by, for example, photolithography method, dry etching, or wet etching, and thereby the metal layers 211G and 221G and the signal line 120A illustrated in FIG. 6 to FIG. 7B are formed on the substrate 111. Next, the whole face is covered with the gate insulating film 212. Subsequently, the channel layers 213 and 223, the channel protective films 214 and 224, the drain regions 215D and 225D, the source regions 215S and 225S, the metal layers 216D and 226D, and the metal layers 216S and 226S are sequentially formed in a given shape on the gate insulating film 212. Together with forming the metal layers 216D and 226D and the metal layers 216S and 226S, the scanning line 130A and the power source supply line 140A are respectively formed as a second metal layer. At this time, a connection section to connect the metal layer 221G with the scanning line 130A, a connection section to connect the metal layer 226D with the signal line 120A, and a connection section to connect the metal layer 226S with the metal layer 211G are previously formed. Thereby, the pixel drive circuit 150 is formed. After that, the whole structure is covered with the passivation film 217. Subsequently, the planarizing insulating film 218 is formed on the passivation film 217, and thereby the pixel drive circuit formation layer 112 is formed, and the base 11 is completed.

Next, the organic light emitting devices 10R, 10G, and 10B are formed. Specifically, an aperture to become the connection hole 114 is provided in the planarizing insulating film 218 by, for example, photolithography method, dry etching, or wet etching. Subsequently, a metal film made of a component material of the foregoing first electrode 12 is formed on the whole area by, for example, sputtering. After that, a resist pattern in a given shape is formed by using a given mask on the metal film. Further, selective etching of the metal film is performed by using the resist pattern as a mask. Thereby, the first electrode 12 and the auxiliary wiring 113 are formed. At this time, the first electrode 12 is formed to fill in the connection hole 114. After that, the interelectrode insulating film 13 is formed to cover the auxiliary wiring 113 and the periphery of the first electrode 12 except for the connection section with the second electrode 15 of the auxiliary wiring 113. Subsequently, the hole injection layer 14A, the hole transport layer 14B, the light emitting layer 14C, and the electron transport layer 14D are sequentially layered to totally cover the first electrode 12, and thereby the organic layer 14 is formed. Subsequently, the organic layer 14 deposited on the connection section with the second electrode 15 of the auxiliary wiring 113 is removed by, for example, irradiating laser light. After that, the second electrode 15 is formed on the whole area to face to the first electrode 12 with the organic layer 14 in between and to cover the auxiliary electrode 113. At this time, the auxiliary electrode 113 is connected with the second electrode 15. Accordingly, the organic light emitting devices 10R, 10G, and 10B are completed.

Subsequently, the reflector structures 20A and 20B are formed. Specifically, first, a base material layer is formed from a component material of the base material 21. Subsequently, the base material layer is patterned by photolithography method or etching method. Thereby, a plurality of circular apertures are formed on the light emitting region 15A of the organic light emitting devices 10R, 10G, and 10B to become the pixel 101, and a rectangular aperture is formed on the light emitting region 15A of the organic light emitting devices 10R, 10G, and 10B to become the pixel 102. After that, the reflective film 22 is formed to selectively cover the side wall of the foregoing apertures. Thereby, the reflector structure 20A including the plurality of circular apertures 21A and the reflector structure 20B including the rectangular aperture 21B are completed.

Finally, the protective layer 25 is formed to cover inside of the apertures 21A and 21B of the reflector structures 20A and 20B and the upper section of the reflector structures 20A and 20B. After that, the adhesive layer is formed on the protective layer 25, and the sealing substrate 26 is attached to the protective layer 25 with the adhesive layer in between. Accordingly, the display unit is completed.

In this display unit, a video is displayed as follows. The scanning signal is supplied from the scanning line drive circuit 130 to the respective pixels 101 and 102 through the gate electrode (metal layer 221G) of the writing transistor Tr2, and an image signal from the signal line drive circuit 120 is retained in the retentive capacity Cs through the writing transistor Tr2. Meanwhile, the power source supply line drive circuit 140 supplies a first electric potential higher than a second electric potential to each power source supply line 140A in synchronization with scanning in units of row by the scanning line drive circuit 130. Thereby, conduction state of the drive transistor Tr1 is selected, the drive current Id is injected into the respective organic light emitting devices 10R, 10G, and 10B, and thereby electron-hole recombination is generated to initiate light emission. The light is reflected by the first electrode 12, and is transmitted through the second electrode 15. The light transmitted through the second electrode 15 is transmitted through the protective layer 25 in the apertures 21A and 21B and the sealing substrate 26 provided on the protective layer 25 and extracted. The video is displayed based on the extracted light.

Figure 8:
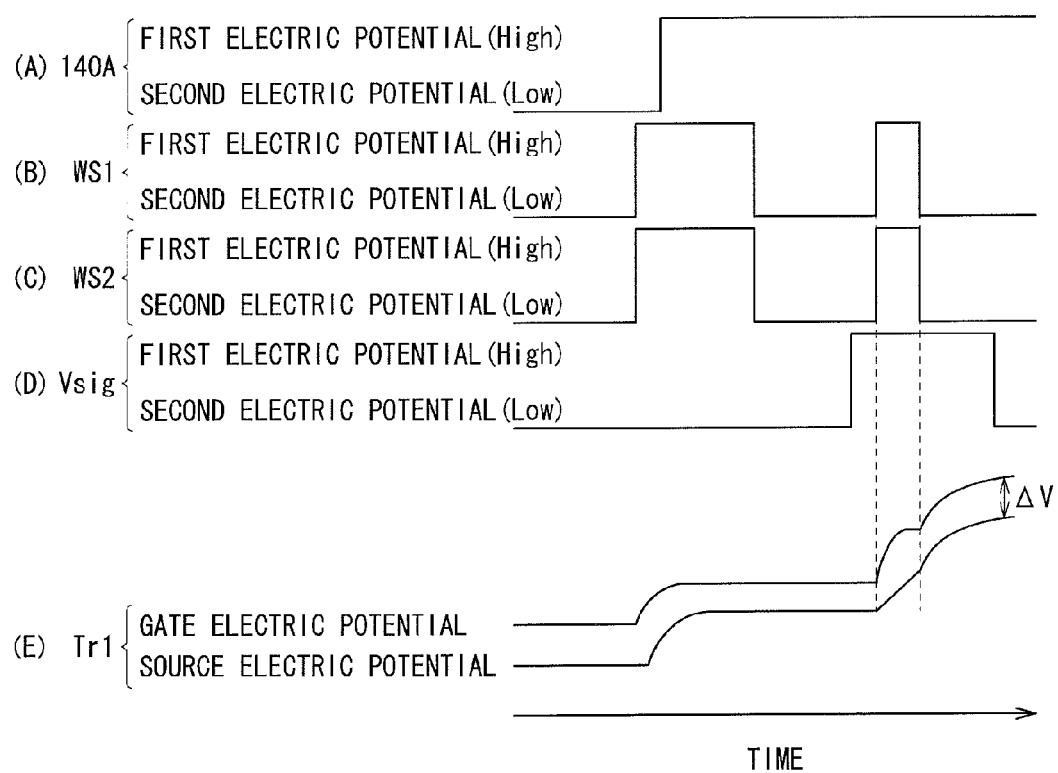
FIG. 8 is a timing chart in the case where the pixel illustrated in FIG. 3 is driven.
Figure 9:
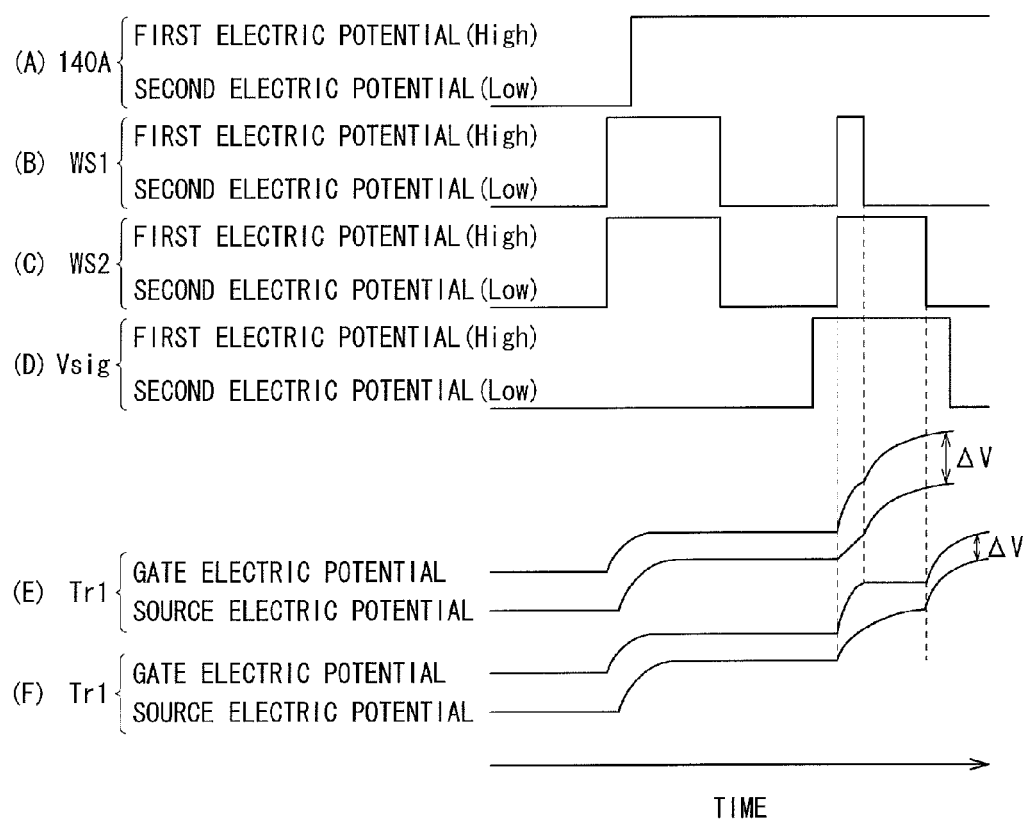
FIG. 9 is another timing chart in the case where the pixel illustrated in FIG. 3 is driven.

In the display unit, in the case where a pair of the pixels 101 and 102 adjacent to each other along the signal line 130A is concurrently driven, a wide view angle is able to be secured. Meanwhile, in the case where the pair of pixels 101 and 102 adjacent to each other along the signal line 130A is driven at each different timing, the view angle is able to be decreased in the front face direction. A description will be given in detail with reference to FIG. 8 and FIG. 9. FIG. 8 illustrates a timing chart for driving the pixels 101 and 102 to secure a wide view angle. FIG. 9 illustrates a timing chart for driving the pixels 101 and 102 to decrease the view angle in the front face direction.

Figure 10:
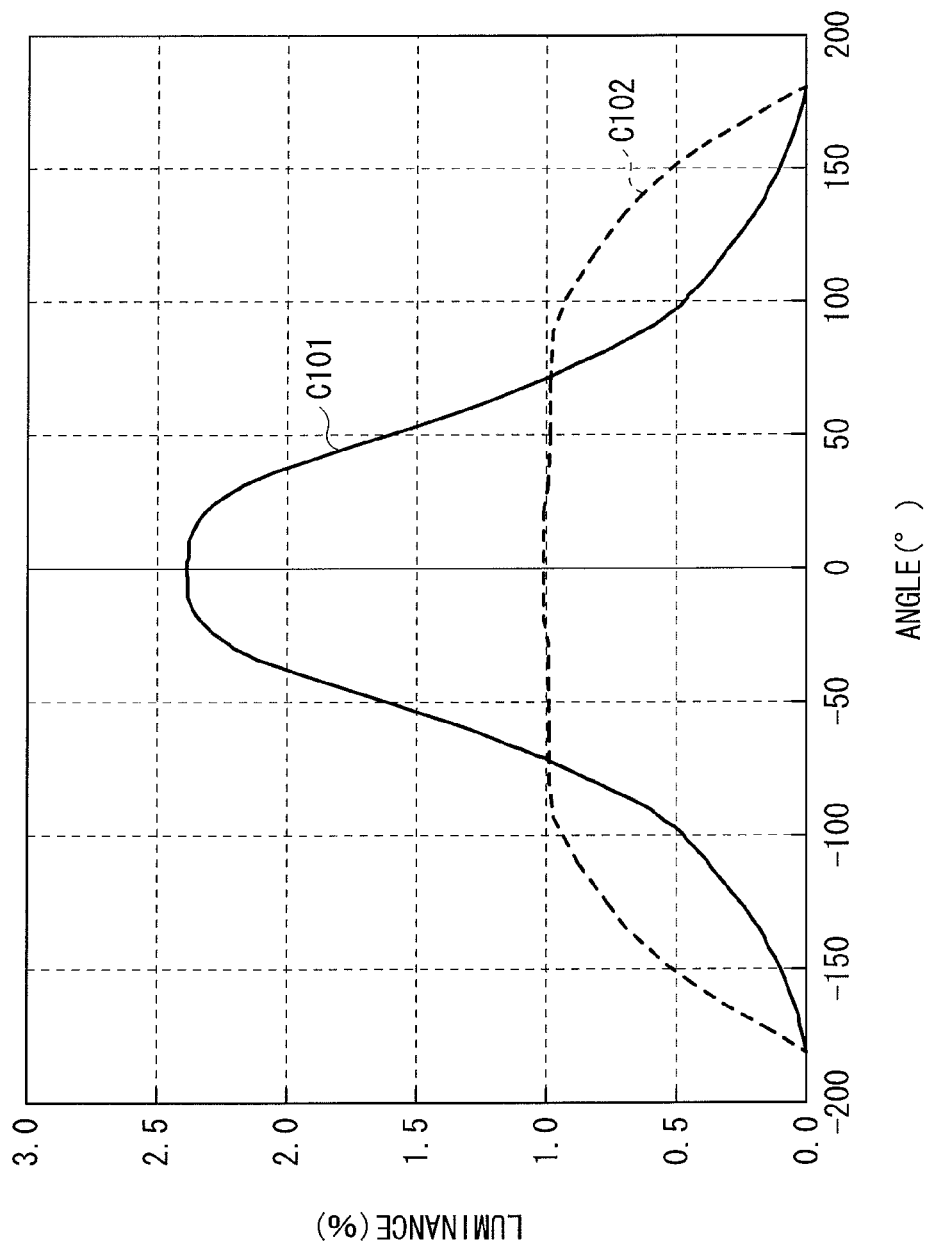
FIG. 10 is a characteristics diagram illustrating luminance distributions in the front face direction and in the diagonal direction to the display face of the pixel illustrated in FIG. 3.

First, a description will be given of the case to secure a wide view angle with reference to FIG. 8. In this case, the pair of pixels 101 and 102 adjacent to each other in the column direction is driven as follows. First, the scanning line drive circuit 130 supplies the following respective signals to the pair of pixels 101 and 102 adjacent to each other in the column direction as follows. That is, the scanning line drive circuit 130 supplies a scanning signal WS1 of the first electric potential (High) higher than the second electric potential (Low) to the writing transistor Tr2 of the pixel 101 (part (B) in FIG. 8), and the scanning line drive circuit 130 supplies a scanning signal WS2 of the first electric potential (High) higher than the second electric potential (Low) to the writing transistor Tr2 of the pixel 102 (part (C) in FIG. 8). In synchronization with the scanning signals WS1 and WS2 of the first electric potential, the power source supply line drive circuit 140 supplies the first electric potential (High) higher than the second electric potential (Low) to the power source supply line 140A of each row of the pixels 101 and 102 (part (A) in FIG. 8). Thereby, the gate electric potential and the source electric potential of the drive transistor Tr1 of both pixels 101 and 102 are increased up to a given electric potential, and then becomes constant (part (E) in FIG. 8). After the scanning signals WS1 and WS2 of the second electric potential are once supplied to the writing transistors Tr1 and Tr2 (part (B) and part (C) in FIG. 8), the signal line drive circuit 120 supplies an image signal Vsig of the first electric potential (High) higher than the second electric potential (Low) to the signal line 120A of the column of the pixels 101 and 102 (part (D) in FIG. 8). After the image signal Vsig of the first electric potential is supplied, the scanning signals WS1 and WS2 of the first electric potential are supplied so that each writing time becomes identical (part (B) and part (C) in FIG. 8). Thereby, a gate electric potential and a source electric potential of the drive transistor Tr1 of both pixels 101 and 102 are further increased, and conduction state of the drive transistor Tr1 of both pixels 101 and 102 is selected. After the conduction state of the drive transistor Tr1 of both pixels 101 and 102 is selected, according to an electric potential difference ΔV between the gate electric potential and the source electric potential of the drive transistor Tr1 of both pixels 101 and 102 (part (E) in FIG. 8), the drive current Id is injected into the respective organic light emitting devices 10R, 10G, and 10B of the pixels 101 and 102, and the light emitting region 15A of the pixels 101 and 102 emits light. The light from the light emitting region 15A is effectively extracted in the front face direction (vertical direction) to the display face by the reflector structure 20A in the pixel 101, and the light from the light emitting region 15A is extracted in the front face direction and the diagonal direction to the display face by the reflector structure 20B in the pixel 102. Thus, as illustrated in FIG. 10, luminance in the front face direction and the diagonal direction is secured. FIG. 10 illustrates luminance distribution (C101) of the pixel 101 placing priority on front face luminance and luminance distribution (C102) of the pixel 102 placing priority on view angle luminance in each direction (from 200 deg to 200 deg) where the vertical direction to the display face is 0 deg.

Meanwhile, in the case where the view angle is decreased in the front face direction (refer to FIG. 9), the pair of the pixels 101 and 102 adjacent to each other in the column direction is driven as follows. First, as in the case to secure a wide view angle, the scanning signals WS1 and WS2 of the first electric potential are supplied to the pair of pixels 101 and 102 adjacent to each other in the column direction (part (B) and part (C) in FIG. 9), and the first electric potential is supplied to the power source supply line 140A of the row of the pixels 101 and 102 (part (A) in FIG. 9). Next, again as in the case to secure a wide view angle, after the scanning signals WS1 and WS2 of the second electric potential are supplied (part (B) and part (C) in FIG. 9), the signal line drive circuit 120 supplies the image signal Vsig of the first electric potential to the column of the pixels 101 and 102 (part (D) in FIG. 9). After the image signal Vsig of the first electric potential is supplied, in order to decrease the view angle in the front face direction, the scanning signal WS1 of the first electric potential is supplied so that the writing time of the scanning signal WS1 of the first electric potential becomes shorter than that of the scanning signal WS2 of the first electric potential (part (B) and part (C) in FIG. 9). Thereby, while the electric potential difference ΔV between the gate electric potential and the source electric potential of the drive transistor Tr1 of the pixel 101 becomes larger (part (E) in FIG. 9), the electric potential difference ΔV between the gate electric potential and the source electric potential of the drive transistor Tr1 of the pixel 102 becomes smaller than the electric potential of the drive transistor Tr1 of the pixel 101 (part (F) in FIG. 9). Thereby, the pixel 101 is selectively driven, and the light emitting region 15A of the pixel 101 mainly emits light. In the result, the light from the light emitting region 15A of the pixel 101 is effectively extracted in the front face direction to the display face by the reflector structure 20A, and thus the view angle is decreased in the front face direction.

As described above, the display unit of this embodiment includes the pixels 101 and 102 and a drive means such as the pixel drive circuit 150 for diving the pixels 101 and 102. The pixel 101 includes the region placing priority on front face luminance in which the aperture ratio of the light emitting region 15A is relatively small. The pixel 102 includes the region placing priority on view angle luminance in which the aperture ratio of the light emitting region 15A is relatively large. The pixels 101 and 102 are adjacent to each other. The pixel 101 has the reflector structure 20A including the plurality of circular apertures 21A having the side wall as the reflecting face 22A. The pixel 102 has the reflector structure 20B including the rectangular aperture 21B having the side wall as the reflecting face 22B. Thus, at least compared to the pixel 102, in the pixel 101, light extracted from the light emitting region 15A to the display face side is less likely to be diffused. Meanwhile, in the pixel 102, light extracted from the light emitting region 15A is wider than that in the pixel 101. Thus, for example, as illustrated in FIG. 8, in the case where the pixels 101 and 102 are similarly driven, each extracted light of the pixels 101 and 102 overlaps together. In the result, while light amount in the front face direction to the display face is increased, light amount in the diagonal direction is also secured. Therefore, balance between luminance in the front face direction and luminance in the diagonal direction to the display face becomes favorable. Accordingly, while increase of power consumption is inhibited, luminance is able to be improved and a wide view angle is able to be secured.

In particular, in this embodiment, the drive means for driving the pixel 101 and the drive means for driving the pixel 102 are independently included. Thereby, for example, by driving as illustrated in FIG. 9, the pixels 101 and 102 are independently driven. Thus, it is possible that the view angle is decreased in the front face direction, a wide view angle is secured, and the view angle of the display unit is controlled. Thus, for example, in the case where the display unit is used as a display of a mobile terminal device, it is not necessary to affix various filters for controlling a view angle such as a peek preventive filter to the display face. In addition, since light absorption by the filter is not generated, a low power consumption display is able to be realized.

In this embodiment, the description has been given of the case that the reflector structure 20A of the pixel 101 has the plurality of circular apertures 21A. However, the shape of the aperture 21A and the number of apertures 21A may be determined so that an aperture ratio relatively small in relation to the pixel 102 side is realized. For example, the planar shape of the aperture 21A may be a rectangle, a polygon, or an oval. However, in order to improve the front face luminance, the planar shape of the aperture 21A is desirably a circle. The number of the apertures 21A is desirably two or more.

Further, in this embodiment, the description has been given of the case that the pixel 102 has the reflector structure 20B. However, the pixel 102 placing priority on view angle is not necessarily provided with the reflector structure 20B. In this case, action and effect similar to those of the foregoing display unit are obtainable.

2. Second Embodiment

Figure 11:
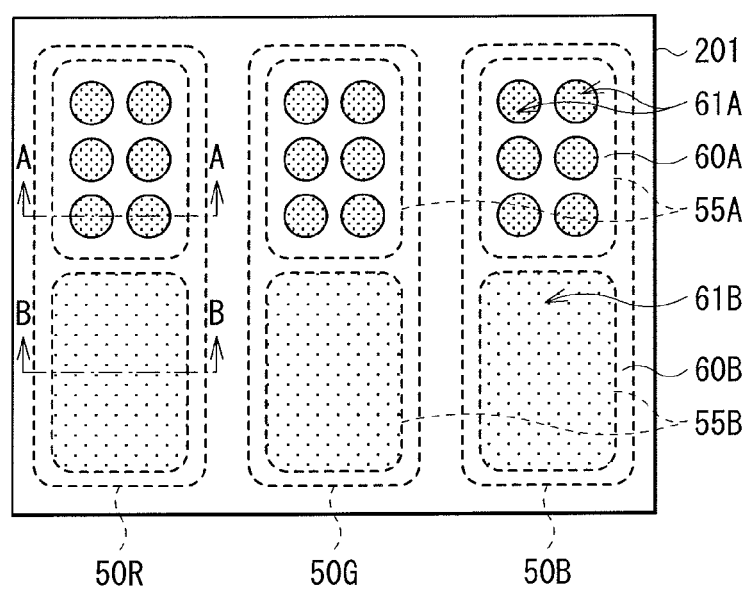
FIG. 11 is a view illustrating a planar structure of a pixel provided in a display unit according to a second embodiment.

Example that a Region Placing Priority on Front Face Luminance and a Region Placing Priority on View Angle Luminance are Included in One Pixel Next, a description will be given of a display unit according to a second embodiment with reference to FIG. 11 to FIG. 13. For the elements common to those of the first embodiment, the same referential symbols will be affixed thereto and the description thereof will be omitted. FIG. 11 illustrates a planar structure of a pixel 201 provided in the display region 110 of the display unit according to the second embodiment of the invention. The display unit of this embodiment includes a region placing priority on front face luminance and a region placing priority on view angle luminance in the pixel 201 in the display region 110. That is, this embodiment has a structure similar to that of the display unit of the first embodiment except that the pixel 201 is provided instead of the pixel 101 placing priority on front face luminance and the pixel 102 placing priority on view angle luminance.

In the display unit, the pixel 201 is provided in the display region 110 in a state of matrix. In the pixel 201, an organic light emitting device 50R generating red light, an organic light emitting device 50G generating green light, and an organic light emitting device 50B generating blue light are formed side by side in this order on the base 11 provided with an after-mentioned pixel drive circuit 250. The organic light emitting devices 50R, 50G, and 50B respectively have light emitting regions 55A and 55B. On the light emitting region 55A of the organic light emitting devices 50R, 50G, and 50B, a reflector structure 60A is formed. The reflector structure 60A has a plurality of circular apertures 61A having a side wall as a reflecting face (reflecting film, not illustrated). Thereby, the aperture ratio of the light emitting region 55A is relatively small. On the light emitting region 55B, a reflector structure 60B is formed. The reflector structure 60B has a rectangle aperture 61B having a side wall as a reflecting face (not illustrated). Thereby, the aperture ratio of the light emitting region 55B is relatively large. The cross sectional structure taken along line A-A in FIG. 11 corresponds to the cross sectional structure illustrated in FIG. 4A. The cross sectional structure taken along line B-B in FIG. 11 corresponds to the cross sectional structure illustrated in FIG. 4B.

That is, in the pixel 201, light extracted from the light emitting region 55A to the display face side is less likely to be diffused due to the reflector structure 60A, while light extracted from the light emitting region 55B is diffused in the diagonal direction as well compared to the light extracted from the light emitting region 55A due to the reflector structure 60B. Thus, in the pixel 201, each extracted light from the light emitting regions 55A and 55B overlaps together. In the result, while light amount in the front face direction to the display face is increased, light amount in the diagonal direction is secured as well.

The light emitting regions 55A and 55B of the organic light emitting devices 50R, 50G, and 50B respectively have a first electrode as an anode, an interelectrode insulating film, an organic layer, and a second electrode as a cathode (not illustrated) sequentially from the base 11 side. The first electrode, the interelectrode insulating film, the organic layer, and the second electrode of the organic light emitting devices 50R, 50G, and 50B respectively have a structure similar to that of the first electrode 12, the interelectrode insulating film 13, the organic layer 14, and the second electrode 15 of the organic light emitting devices 10R, 10G, and 10B.

The reflector structures 60A and 60B have a structure similar to that of the foregoing reflector structures 20A and 20B.

The organic light emitting devices 50R, 50G, and 50B and the reflector structures 60A and 60B are sealed by a protective layer and a sealing substrate (not illustrated) as in the display unit of the first embodiment.

Figure 12:
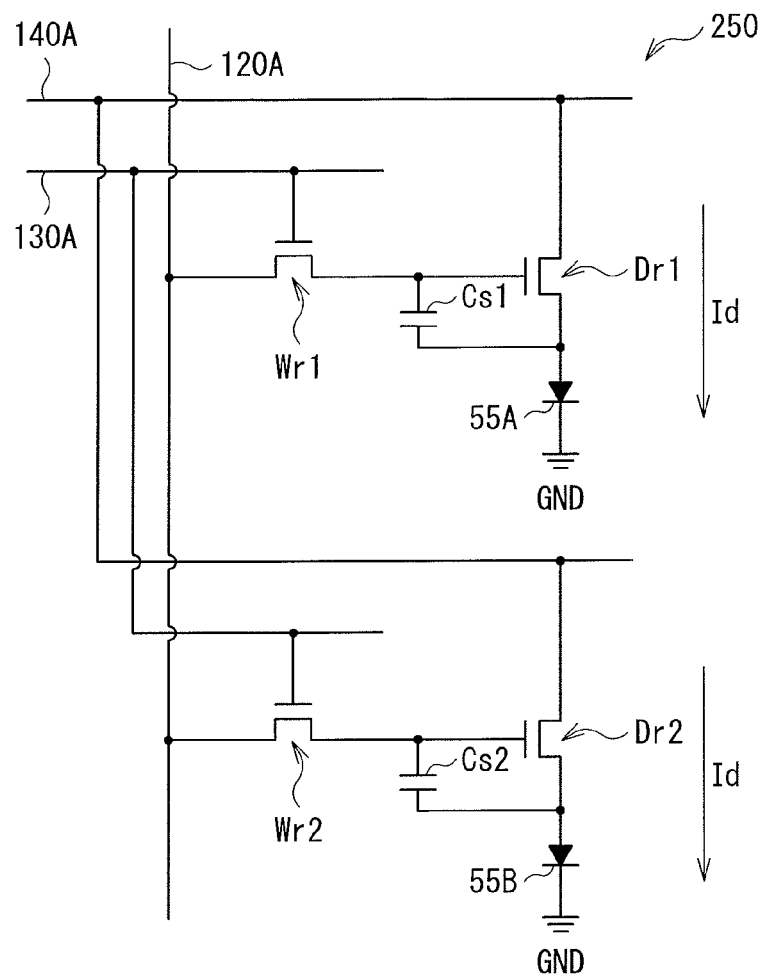
FIG. 12 is a view illustrating an example of a pixel drive circuit for driving the pixel illustrated in FIG. 11.
Figure 13:
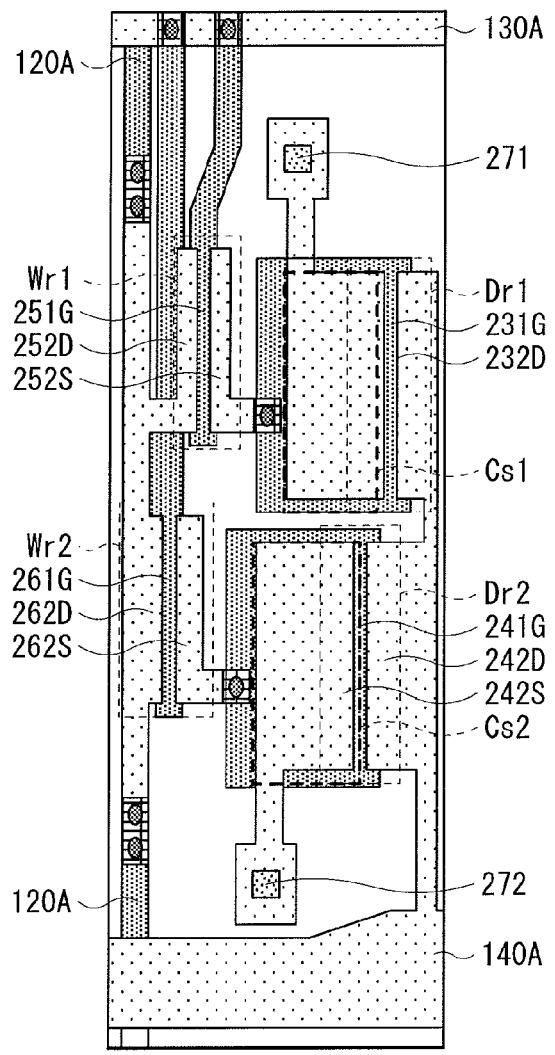
FIG. 13 is a view illustrating a planar structure of the pixel drive circuit illustrated in FIG. 12.

FIG. 12 illustrates an example of the pixel drive circuit 250 corresponding to the organic light emitting device 50R (or 50G, 50B). The pixel drive circuit 250 is an active type drive circuit as the foregoing pixel drive circuit 150 is. The pixel drive circuit 250 is formed in a layer located lower than the respective first electrodes of the light emitting regions 55A and 55B of the organic light emitting device 50R (or 50G, 50B). The pixel drive circuit 250 has a drive transistor Dr1, a writing transistor Wr1, a retentive capacity Cs1 between the drive transistor Dr1 and the writing transistor Wr1, and the light emitting region 55A of the organic light emitting device 50R (or 50G, 50B) serially connected to the drive transistor Dr1 between the power source supply line 140A and the common power source supply line (GND). In addition, the pixel drive circuit 250 has a drive transistor Dr2, a writing transistor Wr2, a capacitor Cs2 between the drive transistor Dr2 and the writing transistor Wr2, and the light emitting region 55B of the organic light emitting device 50R (or 50G, 50B) serially connected to the drive transistor Dr2 between the power source supply line 140A and the common power source supply line.

Respective drain electrodes of the writing transistors Wr1 and Wr2 are, for example, connected to the same signal line 120A. The video signal from the signal line drive circuit 120 is supplied to the drain electrodes of the writing transistors Wr1 and Wr2. Respective gate electrodes of the writing transistors Wr1 and Wr2 are connected to the same scanning line 130A. The scanning signal from the scanning line drive circuit 130 is supplied to the gate electrodes of the writing transistors Wr1 and Wr2. Further, a source electrode of the writing transistor Wr1 is connected to a gate electrode of the drive transistor Dr1. A source electrode of the writing transistor Wr2 is connected to a gate electrode of the drive transistor Dr2.

For example, respective drain electrodes of the drive transistors Dr1 and Dr2 are connected to the power source supply line 140A, and one of the first electric potential and the second electric potential by the power source supply line drive circuit 140 is set. A source electrode of the drive transistor Dr1 is connected to the light emitting region 55A of the organic light emitting device 50R (or 50G, 50B). A source electrode of the drive transistor Dr2 is connected to the light emitting region 55B of the organic light emitting device 50R (or 50G, 50B). Specifically, the source electrode of the drive transistor Dr1 is connected to the first electrode corresponding to the light emitting region 55A through a connection hole 271, and the source electrode of the drive transistor Dr2 is connected to the first electrode corresponding to the light emitting region 55B through a connection hole 272.

The retentive capacity Cs1 is formed between the gate electrode of the drive transistor Dr1 (source electrode of the drive transistor Wr1) and the source electrode of the drive transistor Dr1. The retentive capacity Cs2 is formed between the gate electrode of the drive transistor Dr2 (source electrode of the writing transistor Wr2) and the source electrode of the drive transistor Dr2.

Next, a description will be given of a detailed structure of the base 11 on which the organic light emitting device 50R (or 50G, 50B) is formed with reference to FIG. 13 in addition to FIG. 11 and FIG. 12. In the base 11, the pixel drive circuit formation layer 112 including the pixel drive circuit 250 is provided on the substrate 111 as well.

On the surface of the substrate 111, as a metal layer of a first layer, a metal layer 231G as the gate electrode of the drive transistor Dr1, a metal layer 241G as the gate electrode of the drive transistor Dr2, a metal layer 251G as the gate electrode of the writing transistor Wr1, a metal layer 261G as the gate electrode of the writing transistor Wr2, and the signal line 120A are respectively provided. The metal layers 231G, 241G, 251G, and 261G and the signal line 120A are covered with a gate insulating film composed of silicon nitride, silicon oxide or the like. In a region corresponding to the metal layers 231G, 241G, 251G, and 261G on the gate insulating film, a channel layer made of a semiconductor thin film composed of amorphous silicon or the like is respectively provided. On the respective channel layers of the drive transistors Dr1 and Dr2 and the writing transistors Wr1 and Wr2, an insulative channel protective film is provided to occupy a channel region as a central region of the channel layer. In the region on both sides of the respective channel protective films, a source region and a drain region made of an n-type semiconductor thin film composed of n-type amorphous silicon or the like are provided. The drain region and the source region are separated from each other with a channel protective film in between. End faces thereof are separated from each other with the channel region in between. Further, as a metal layer of a second layer, metal layers 232D, 242D, 252D, and 262D as a drain wiring and a drain electrode and metal layers 232S, 242S, 252S, and 262S as a source wiring and a source electrode are provided to respectively cover the respective drain regions and the respective source regions of the drive transistors Dr1 and Dr2 and the writing transistors Wr1 and Wr2. The metal layers 232D, 242D, 252D, and 262D and the metal layers 232S, 242S, 252S, and 262S have a structure in which, for example, a titanium layer, an aluminum layer, and a titanium layer are sequentially layered. As a metal layer of the second layer, in addition to the foregoing metal layers 232D, 242D, 252D, and 262D and the metal layers 232S, 242S, 252S, and 262S, the scanning line 130A and the power source supply line 140A are provided. Such a pixel drive circuit 250 is covered with the passivation film 217, on which the planarizing insulating film 218 is provided as the pixel drive circuit 150 is.

The display unit is able to be manufactured in the same manner as the display unit in the foregoing first embodiment.

In this display unit, the scanning signal is supplied from the scanning line drive circuit 130 to the pixel 201 through the gate electrodes (metal layers 231G and 241G) of the writing transistors Wr1 and Wr2, and an image signal from the signal line drive circuit 120 is retained in the retentive capacities Cs1 and Cs2 through the writing transistors Wr1 and Wr2. Meanwhile, the power source supply line drive circuit 140 supplies the first electric potential higher than the second electric potential to the power source supply line 140A in synchronization with scanning in units of row by the scanning line drive circuit 130. Thereby, conduction state of the drive transistors Dr1 and Dr2 is selected, the drive current Id is injected into the respective organic light emitting devices 50R, 50G, and 50B, and thereby electron-hole recombination is generated to initiate light emission. The light is reflected by the first electrode, and is transmitted through the second electrode. The light transmitted through the second electrode is transmitted through the protective layer in the apertures 61A and 61B and the sealing substrate provided on the protective layer and extracted.

As described above, the display unit of this embodiment includes the plurality of pixels 201 and the pixel drive circuit 250 or the like for diving the pixel 201. The pixel 201 includes the region placing priority on front face luminance in which the aperture ratio of the light emitting region 55A is relatively small and the region placing priority on view angle luminance in which the aperture ratio of the light emitting region 55B is relatively large. On the light extraction side of the light emitting region 55A of the pixel 201, the reflector structure 60A including the plurality of circular apertures 61A having the side wall as the reflecting face is provided. On the light extraction side of the light emitting region 55B, the reflector structure 60B including the rectangular aperture 61B having the side wall as the reflecting face is provided. Thus, in the pixel 201, light extracted from the light emitting region 55A to the display face side is less likely to be diffused, and is outputted in the front face direction. Meanwhile, light extracted from the light emitting region 55B is diffused in the diagonal direction as well compared to the light extracted from the light emitting region 55B. Thus, in the pixel 201, each extracted light from the light emitting regions 55A and 55B overlaps together. In the result, while light amount in the front face direction to the display face is increased, light amount in the diagonal direction is secured. Therefore, balance between luminance in the front face direction and luminance in the diagonal direction to the display face becomes favorable. Accordingly, while increase of power consumption is inhibited, luminance is able to be improved and a wide view angle is able to be secured. In this case, since each pixel 201 includes the region placing priority on front face luminance and the region placing priority on view angle luminance, resolution of a displayed video is able to be more improved than in the case that these regions are included in each different pixel.

In this embodiment, the description has been given of the case that the metal layers 251G and 261G as the gate electrode of the writing transistors Wr1 and Wr2 are connected to the same scanning line 130A in the pixel drive circuit 250. However, the metal layers 251G and 261G as the gate electrode of the writing transistors Wr1 and Wr2 may be connected to each different scanning line 130A. Thereby, the light emitting regions 55A and 55B are able to be driven independently. Accordingly, as in the display unit of the first embodiment, it is possible that the view angle is decreased in the front face direction, a wide view angle is secured, and the view angle is controlled.

3. Module and Application Examples

A description will be given of application examples of the display unit described in the foregoing respective embodiments. The display unit of the foregoing respective embodiments is able to be applied to a display unit of electronics devices in any field for displaying a video signal inputted from outside or a video signal generated inside as an image or a video such as a television device, a digital camera, a notebook personal computer, a portable terminal device such as a mobile phone, and a video camera.

Module

Figure 14:
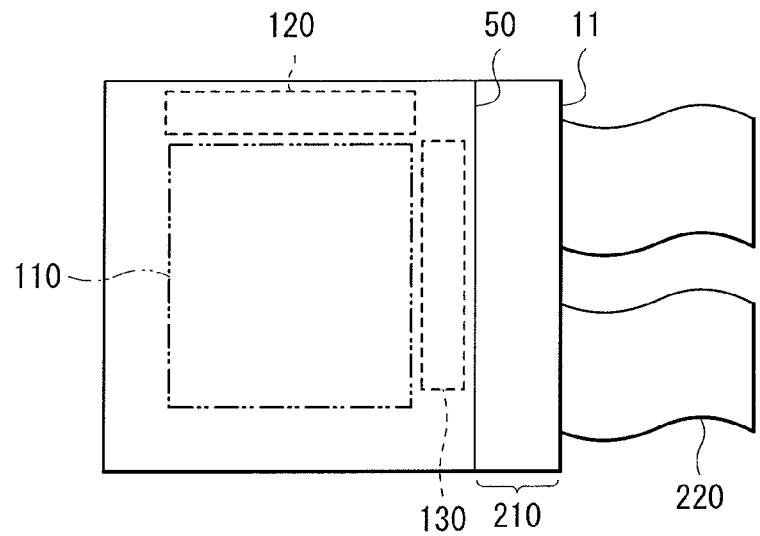
FIG. 14 is a plan view illustrating a schematic structure of a module including the display unit of the respective embodiments.

The display unit of the foregoing respective embodiments is incorporated in various electronics devices such as aftermentioned first to fifth application examples as a module as illustrated in FIG. 14, for example. In the module, for example, a region 210 exposed from the sealing substrate 26 and the adhesive layer is provided in a side of the base 11, and an external connection terminal (not illustrated) is formed in the exposed region 210 by extending wirings of the signal line drive circuit 120 and the scanning line drive circuit 130. The external connection terminal may be provided with a Flexible Printed Circuit (FPC) 220 for inputting and outputting a signal.

First Application Example

Figure 15:
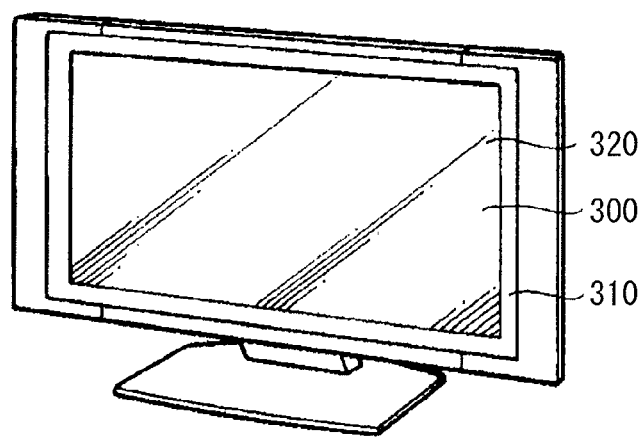
FIG. 15 is a perspective view illustrating an appearance of a first application example of the display unit of the respective embodiments.

FIG. 15 illustrates an appearance of a television device to which the display unit of the foregoing respective embodiments is applied. The television device has, for example, a video display screen section 300 including a front panel 310 and a filter glass 320. The video display screen section 300 is composed of the display unit according to the foregoing respective embodiments.

Second Application Example

FIGS. 16A and 16B illustrate an appearance of a digital camera to which the display unit of the foregoing respective embodiments is applied. The digital camera has, for example, a light emitting section for a flash 410, a display section 420, a menu switch 430, and a shutter button 440. The display section 420 is composed of the display unit according to the foregoing respective embodiments.

Third Application Example

Figure 17:
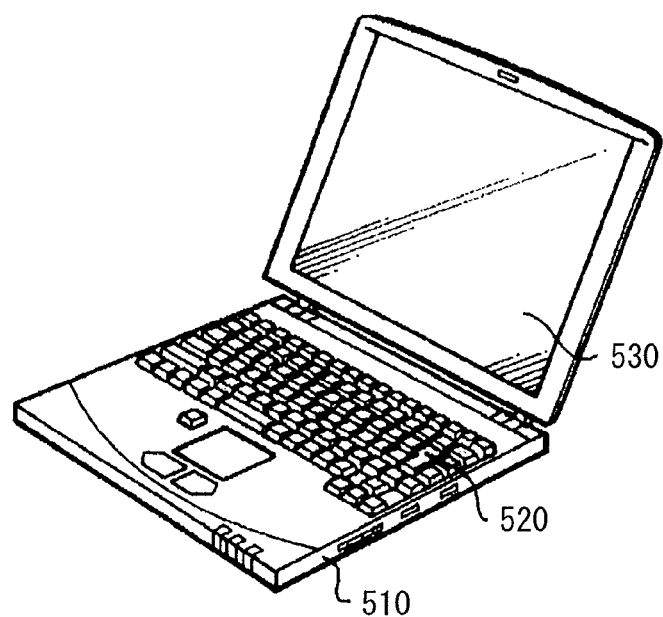
FIG. 17 is a perspective view illustrating an appearance of a third application example.

FIG. 17 illustrates an appearance of a notebook personal computer to which the display unit of the foregoing respective embodiments is applied. The notebook personal computer has, for example, a main body 510, a keyboard 520 for operation of inputting characters and the like, and a display section 530 for displaying an image. The display section 530 is composed of the display unit according to the foregoing respective embodiments.

Fourth Application Example

Figure 18:
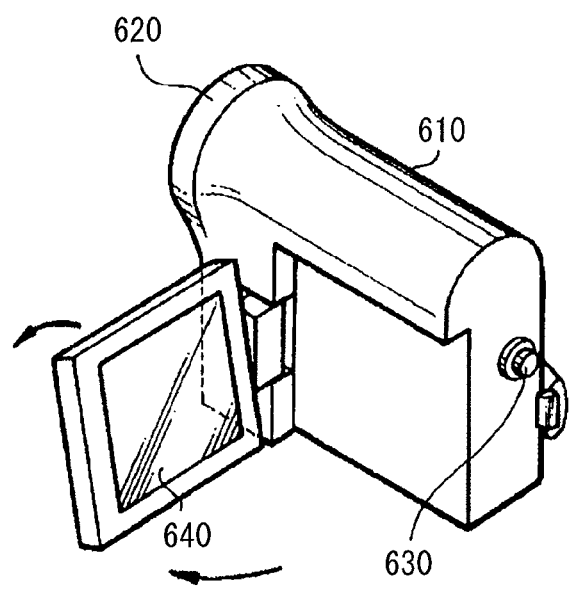
FIG. 18 is a perspective view illustrating an appearance of a fourth application example.

FIG. 18 illustrates an appearance of a video camera to which the display unit of the foregoing respective embodiments is applied. The video camera has, for example, a main body 610, a lens for capturing an object 620 provided on the front side face of the main body 610, a start/stop switch in capturing 630, and a display section 640. The display section 640 is composed of the display unit according to the foregoing respective embodiments.

Fifth Application Example

FIGS. 19A to 19G illustrate an appearance of a mobile phone to which the display unit of the foregoing respective embodiments is applied. In the mobile phone, for example, an upper package 710 and a lower package 720 are jointed by a joint section (hinge section) 730. The mobile phone has a display 740, a sub-display 750, a picture light 760, and a camera 770. The display 740 or the sub-display 750 is composed of the display unit according to the foregoing respective embodiments.

While the invention has been described with reference to the embodiments, the invention is not limited to the foregoing embodiments, and various modifications may be made. For example, in the foregoing embodiments, the description has been given of the case that the first electrode of the organic light emitting device is the anode and the second electrode is the cathode. However, it is possible that by contraries, the first electrode is a cathode and the second electrode is an anode.

Further, in the foregoing embodiments, the description has been specifically given of the respective structures of the red, green, and blue organic light emitting devices. However, it is not necessary to provide all layers, or it is possible to further provide other layer. For example, an electron hole injection thin film layer composed of chromium oxide (III) ($Cr_2O_3$), ITO or the like may be provided between the first electrode and the organic layer.

Furthermore, in the foregoing embodiments, the description has been specifically given of the active matrix type display unit. However, the invention is applicable to a passive matrix type display unit as well. Furthermore, the structure of the pixel drive circuit for driving the active matrix is not limited to the case described in the foregoing embodiments and the like, and a capacity device or a transistor may be added according to needs. In this case, according to the change of the pixel drive circuit, a necessary drive circuit may be added in addition to the signal line drive circuit and the scanning line drive circuit.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display unit comprising:
   a first region placing priority on front face luminance in which an aperture ratio of a light emitting region is relatively small, wherein the first region includes a plurality of organic light emitting devices generating red, green, and blue lights, respectively, that are two-dimensionally arranged in a matrix state and each of the organic light emitting devices is formed of a first reflector structure having a plurality of apertures;
   a second region placing priority on view angle luminance in which the aperture ratio of the light emitting region is relatively large, wherein the second region includes a plurality of organic light emitting devices generating red, green, and blue lights, respectively, and the first and second regions are disposed adjacent to each other and two-dimensionally arranged in a state of matrix, and
   wherein each of the organic light emitting devices in the second region is formed of a second reflector structure having a single aperture; and
   a drive means for driving the first region and the second region.

2. The display unit according to claim 1 having a plurality of pixels, wherein the first region and the second region are included in each different pixel.

3. The display unit according to claim 2, wherein the first region has a first reflector structure including a plurality of apertures having a side wall as a reflecting face on an organic light emitting device.

4. The display unit according to claim 3, wherein
   the second region has a second reflector structure including an aperture having a side wall as a reflecting face on the organic light emitting device; and
   a number of apertures of the second reflector structure is less than that of the first reflector structure.

5. The display unit according to claim 4, wherein a planar shape of each aperture of the first reflector structure is circular, and
   a planar shape of the aperture of the second reflector structure is rectangular.

6. The display unit according to claim 1 having a plurality of pixels, wherein the first region and the second region are included in the same pixel.

7. The display unit according to claim 1, wherein the drive means has a first drive means for driving the first region and a second drive means for driving the second region, and the drive means concurrently drives the first region and the second region.

8. The display unit according to claim 1, wherein the drive means has a first drive means for driving the first region and a second drive means for driving the second region, and the drive means drives the first region and the second region at different timing.

9. A display unit comprising:
   a first region placing priority on front face luminance in which an aperture ratio of a light emitting region is relatively small, wherein the first region includes a plurality of organic light emitting devices generating red, green, and blue lights, respectively, that are two-dimensionally arranged in a matrix state and each of the organic light emitting devices is formed of a first reflector structure having a plurality of apertures;
   a second region placing priority on view angle luminance in which the aperture ratio of the light emitting region is relatively large, wherein the second region includes a plurality of organic light emitting devices generating red, green, and blue lights, respectively, and the first and second regions are disposed adjacent to each other and two-dimensionally arranged in a state of matrix, the first and second regions being included in each different pixel,
   wherein each of the organic light emitting devices in the second region is formed of a second reflector structure having a single aperture; and
   a drive section driving the first region and the second region.

* * * * *